United States Patent
Ouyang

(10) Patent No.: US 8,342,234 B2
(45) Date of Patent: Jan. 1, 2013

(54) PLASMA-DRIVEN COOLING HEAT SINK

(76) Inventor: Chien Ouyang, Sunnyvale, CA (US)

( * ) Notice: Subject to any disclaimer, the term of this patent is extended or adjusted under 35 U.S.C. 154(b) by 1240 days.

(21) Appl. No.: 12/157,232

(22) Filed: Jun. 8, 2008

(65) Prior Publication Data

US 2008/0302510 A1  Dec. 11, 2008

Related U.S. Application Data

(60) Provisional application No. 60/934,048, filed on Jun. 11, 2007.

(51) Int. Cl.
*F28F 7/00* (2006.01)
*H05K 7/20* (2006.01)

(52) U.S. Cl. ..................... 165/83; 165/104.34

(58) Field of Classification Search ................. 165/80.3, 165/185, 104.34; 361/690, 694, 703; 417/49
See application file for complete search history.

(56) References Cited

U.S. PATENT DOCUMENTS

| | | | |
|---|---|---|---|
| 5,554,344 A | 9/1996 | Duarte | |
| 6,313,399 B1 * | 11/2001 | Suntio et al. | 174/17 VA |
| 7,190,587 B2 * | 3/2007 | Kim et al. | 361/704 |
| 7,269,008 B2 * | 9/2007 | Mongia et al. | 361/689 |
| 7,545,640 B2 * | 6/2009 | Fisher et al. | 361/694 |
| 2002/0126448 A1 * | 9/2002 | Brewer et al. | 361/687 |
| 2005/0007726 A1 * | 1/2005 | Schlitz et al. | 361/330 |
| 2006/0061967 A1 | 3/2006 | Kim et al. | |
| 2006/0169441 A1 * | 8/2006 | Schlitz | 165/121 |
| 2007/0171593 A1 * | 7/2007 | DuBose | 361/225 |
| 2008/0060794 A1 * | 3/2008 | Wei | 165/109.1 |

FOREIGN PATENT DOCUMENTS

JP  2006302918 A  * 11/2006

* cited by examiner

*Primary Examiner* — Tho V Duong
(74) *Attorney, Agent, or Firm* — Bo-In Lin

(57) ABSTRACT

A plasma-driven cooling device generates and drives a plasma-driven gas flow to cool down electronic devices. The plasma-driven cooling device comprises electrodes, dielectric pieces, and heat sink fins. The voltages applied on the electrodes coupled with dielectric pieces and heat sink fins induce the gas flow, which is used to cool down heat sources. A magnetic circuit may be coupled with plasma-drive gas flow to enhance the cooling.

6 Claims, 16 Drawing Sheets

PLASMA-DRIVEN COOLING HEAT SINK

This application is a Formal Application and claims priority to U.S. patent application 60/934,048 filed on Jun. 11, 2007 by the same Applicant of this Application, the benefit of its filing date being hereby claimed under Title 35 of the United States Code.

BACKGROUND OF THE INVENTION

1. Field of the Invention

The present invention relates generally to electronic equipment, and more particularly, to apparatus and methods for cooling electronic devices using plasma-driven gas flow.

2. Description of the Related Art

Electronic devices may generate significant heat during operation. High temperatures may reduce the lifespan of these devices, and, therefore, the generated heat may need to be dispersed to keep the operating temperature of the electronic devices within acceptable limits.

One commonly used cooling device is heat sink. Heat sinks may be coupled to electronic devices to absorb heat through the heat sink base and disperse the heat through their fins. Conventional methods to disperse the heat through the heat sink fins are natural convection and forced convection. Natural convection is to disperse the heat away from the surfaces of heat sink fins without the aid of external forced fluid pumping through heat sink fins. On the other hand, the forced convection cooling is to pump the fluid to flow through heat sink fins, such as the fans to blow the air through the heat sink fins, and therefore increase the heat transfer between fins and outside ambient.

With the increasing power density of electronic devices, the pitch or the distance between heat sink fins is becoming smaller, which means more surface area may be used to transport the heat away. However, when the pitch becomes very small, the pressure drop between inlet and outlet of the heat sink fins may become very high, which may result the difficulties to pump the fluid flowing through fins, and as a result, more powerful fans, which consume higher electricity may be needed for the cooling. The invention utilizes plasma-driven gas flow to conduct the convective heat transfer inside the heat sink fins and therefore will resolve these issues.

Another consideration of the cooling of the electronic devices is that, due to the size concern, the internal space allowed to put cooling fans and other cooling components, may be limited or not permitted. The invention utilizes the plasma-driven gas flow to generate the forced convective heat transfer inside the heat sink fins, and hence, is able to improve the heat transfer efficiency and to minimize the required space because the cooling components are assembled inside heat sink fins.

Another aspect of using the invention is to lower required power of the system fan power inside electronic devices. The plasma driven gas flow inside the heat sink fins will induce the local turbulence on the heat sink surface, and higher momentum of the fluid is obtained. Therefore, in this way, the system fan doesn't need to be very powerful in order to cool down heat source.

Plasma-driven gas flow has been used either to cool articles or to control and modify the fluid dynamics boundary layer on the wings surfaces of the aerodynamic vehicles. For example, U.S. Pat. No. 3,938,345 used the phenomenon of corona discharge, which is one type of plasma, to do the local cooling of an article. U.S. Pat. No. 4,210,847 designed an apparatus for generating an air jet for cooling application. U.S. Pat. No. 5,554,344 had a gas ionization device to do the cooling of zone producing chamber. U.S. Pat. No. 6,796,532 B2 used a plasma discharge to manipulate the boundary layer and the angular locations of its separation points in cross flow planes to control the symmetry or asymmetry of the vortex pattern.

However, none of the above patents are coupled to the heat sink, which is a fundamental apparatus for cooling electronic devices. Hence, what are needed are a method and an apparatus, to couple with heat sink fins to cool down electronic devices efficiently.

SUMMARY OF THE INVENTION

One embodiment of the present invention provides a plasma-driven cooling device couple to heat sink fins to induce the gas flow on the heat sink fins. The induced gas flow will remove the heat away from heat sink surface and therefore the heat source is cool down.

In one embodiment, the plasma-driven cooling device includes the electrodes, dielectric pieces, and heat sink fins. The electrodes and heat sink fins edges may have different patterns. The dimensions and relative locations of electrodes, dielectric pieces, and heat sinks can be varied in order to attain specific plasma and air flowing patterns and distributions.

In a further variation on this embodiment, the plasma-driven cooling device in the plasma-driven cooling device array may be separately controlled and powered, such as, by a controller and a power supplier, to provide different cooling rates at different locations on the heat sink fins.

In one embodiment, plasma-driven gas may flow in varied directions and the flow patterns may be varied. The electrodes, heat sink fins, and dielectric pieces may have varied configurations.

In one embodiment, varied voltages may be applied to the electrodes and heat sink fins to induce the fluid movement. The applied voltages may have varied waveforms, frequencies, amplitude, phase shifts, and time period.

In one embodiment, a magnetic field may be added into the cooling system and the magnetic field may be provided by permanent magnets or electromagnets. The magnetic field will interact with plasma-driven gas flow to enhance the heat transfer and to induce turbulent flow.

BRIEF DESCRIPTION OF THE DRAWINGS

A better understanding of the present invention may be obtained when the following detailed description is considered in conjunction with the following drawings, in which.

Figure 1:
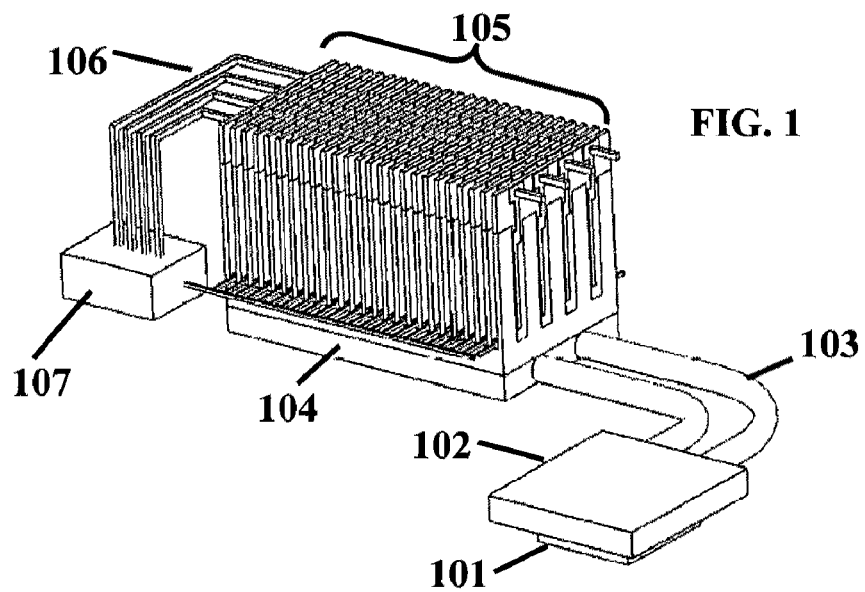
FIG. 1 illustrates a plasma-driven cooling device to cool down a heat source, according to an embodiment.

While the invention is susceptible to various modifications and alternative forms, specific embodiments thereof are shown by way of examples in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION OF THE INVENTION

The invention generally relates to apparatus for cooling microelectronic chips or devices, such as microprocessors, and ASIC. Such systems and methods may be used in a variety of applications. A non-exhaustive list of such applications includes the cooling of: a microprocessor chip, a graphics processor chip, an ASIC chip, a video processor chip, a DSP chip, a memory chip, a hard disk drive, a graphic card, a portable testing electronics, and a personal computer system.

Take laptop computer for example, conventional fans use a lot of space and energy. For this reason, the plasma-driven cooling device represents a way to increase their cooling capacity and make them more reliable and far quieter. Therefore the higher-performance chips that generate too much heat for current laptops can be used.

As used herein "plasma" is an ionized gas, a gas into which sufficient energy is provided to free electrons from atoms or molecules and to allow both species, ions and electrons, to coexist. Plasma is even common here on earth. A plasma is a gas that has been energized to the point that some of the electrons break free from, but travel with, their nucleus. Gases can become plasmas in several ways, but all include pumping the gas with energy. A spark in a gas will create a plasma. A hot gas passing through a big spark will turn the gas stream into a plasma that can be useful. Plasma torches like that are used in industry to cut metals.

As used herein "electrode" is an electrical conductor used to make contact with a metallic part of a circuit.

As used herein "dielectric piece" is a substance that is a poor conductor of electricity, but an efficient supporter of electrostatic fields. In practice, most dielectric materials are solid. Some liquids and gases can serve as good dielectric materials. Dry air is an excellent dielectric, and is used in variable capacitors and some types of transmission lines. Distilled water is a fair dielectric. A vacuum is an exceptionally efficient dielectric. An important property of a dielectric is its ability to support an electrostatic field while dissipating minimal energy in the form of heat. The lower the dielectric loss (the proportion of energy lost as heat), the more effective is a dielectric material.

Figure 2:
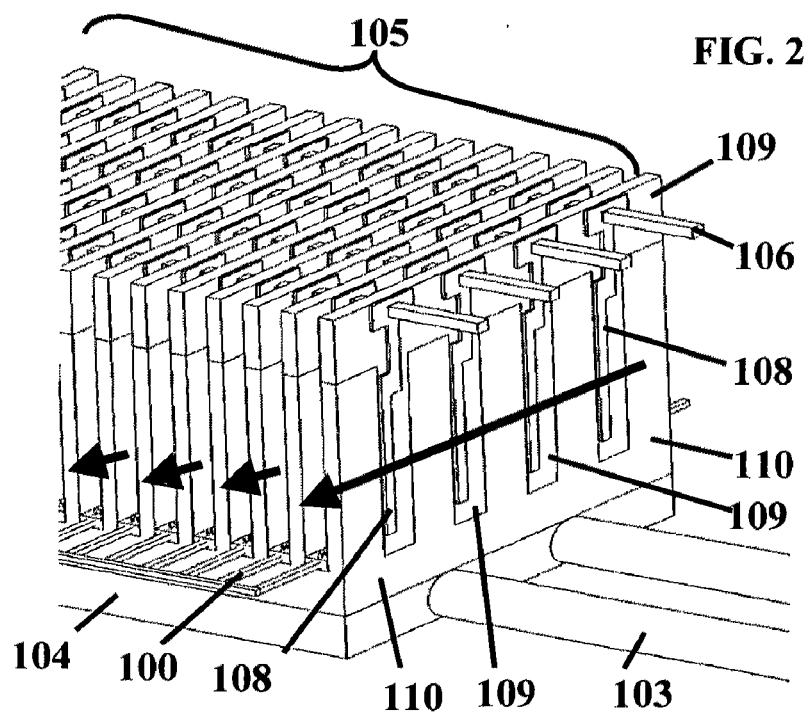
FIG. 2 illustrates a plurality of plasma-driven cooling devices, according to an embodiment.

FIG. 1 illustrates a configuration of an electronic cooling device. Heat source 101 generates heat and the heat is transferred to the heat sink fin assembly 105, through attachment component 102, heat transferring pipes 103, and heat sink base 104. The attachment component 102 couples with heat source 101 and heat transferring pipes 103. The heat transfer pipes 103 may be heat pipes, liquid cooling pipes, refrigeration pipes, and other heat transferring pipes. The lead wires 106 connect the electrodes 108, which are on the dielectric piece 109, to the power supplier and controller 107. FIG. 2 illustrates detailed view of the heat sink fin assembly 105, which has four lead wires 106 and each lead wire 106 connects to a row of electrodes 108 on the heat sink fins 110 and to the power supplier and controller 107. In one embodiment, varied numbers of lead wires 106, electrodes 108, dielectric pieces 109, and heat sink fins 110 may be implemented.

In one embodiment, the power supplier and controller 107 may separately provide the voltage to each electrode 108 to activate the plasma-driven gas flow, and may separately control each actuator. In another embodiment, temperature sensors, which are not shown here, may be coupled to heat sink source 101, heat transferring pipes 103, heat sink fins assembly 105. Therefore, the controller and power supplier 107, based on measured temperatures, determine the powers and voltages to the electrodes 108.

Figure 3:
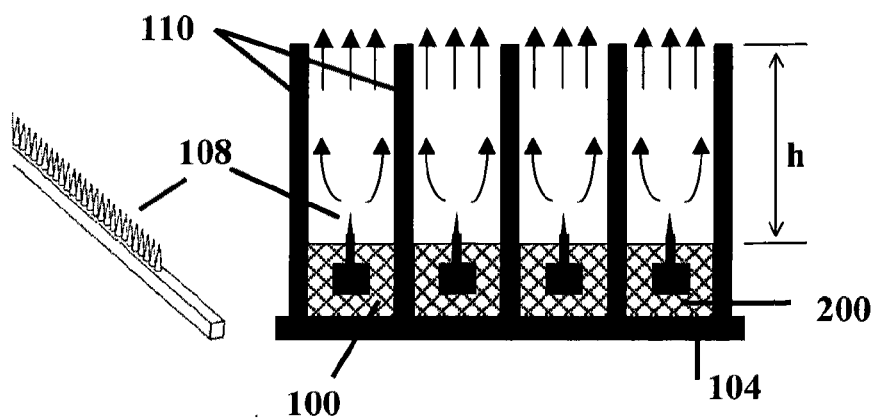
FIG. 3 illustrates a plasma-driven cooling device array coupled to a heat sink, according to an embodiment.

FIG. 3 illustrates an embodiment of a plasma-driven cooling device. The device utilizes a "corona wind" mechanism, which is one type of plasma, to induce the gas flow. The heat sink fins 110 in the figure acts as collector and the sharp electrodes 108 array act as emitter to ionize the air near the electrode 108 tips and therefore induce the gas flow in a direction as the arrows shown. Electrically insulating material 100 is between electrodes 108 and heat sink fins 110. The heat sink fins 110 and heat sink base 104 may be electrically connected or not connected. In one embodiment, by applying the voltages to the electrodes 108 array, the cooling device may be activated to make the gas to flow in a vertical direction away from the heat sink base 104. In another embodiment, the heat sink fins 110 may be electrically grounded and the heat sink fins may have many different sections to be applied with varied electrical potentials. The heat sink sections may be separated by electrically non-conductive material. FIG. 3 illustrates one sharp electrodes 108 array populated on heat sink base 104 and between heat sink fins 110. In one embodiment, multiple arrays with varied configurations or patterns may be populated on heat sink base 104 and between heat sink fins 110.

Figure 4A:
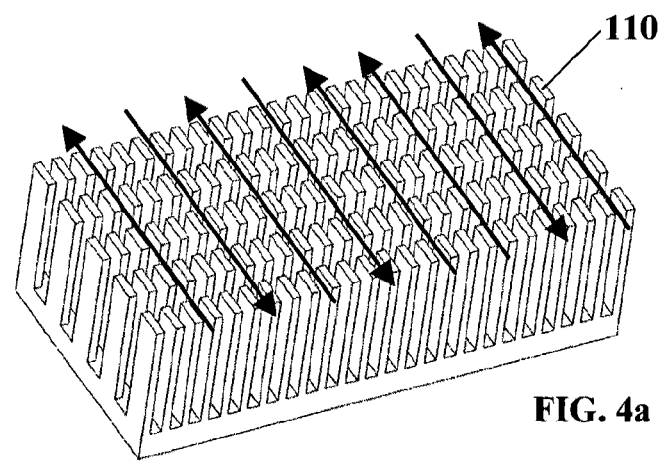
FIG. 4 illustrates the plasma-driven cooling devices coupled to the heat sink fins, according to an embodiment.
Figure 4B:
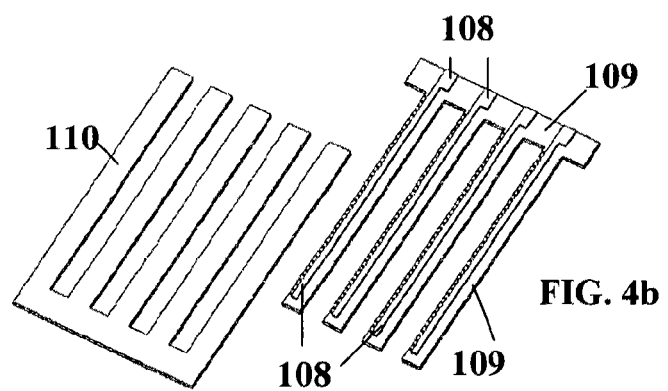

FIG. 4a illustrates another configuration of a plasma cooling device. By arranging the electrodes 108, dielectric pieces 109, and heat sink fins 110, the plasma-driven gas may flow between heat sink fins and in a direction parallel to the heat sink base 104. For this configuration, as shown in detail in FIG. 4b, the heat sink fins are coupled together, and the dielectric pieces 109 are couple together as well. In one embodiment, heat sink fins may be separated from each other, and the dielectric pieces 109 may be separated from each other.

In one embodiment, the configurations as shown in FIG. 3 and FIG. 4 may be coupled together to induce the plasma-driven gas to flow in varied directions. The configuration as shown in FIG. 3 induce the plasma-driven gas flow at the region near the heat sink base, and the configuration as shown in FIG. 4 induce the gas flow at outer heat sink fins areas. The utilization of the configuration as shown in FIG. 4 will greatly improve the heat transfer because a larger heat sink fins areas are used.

Figure 5A:
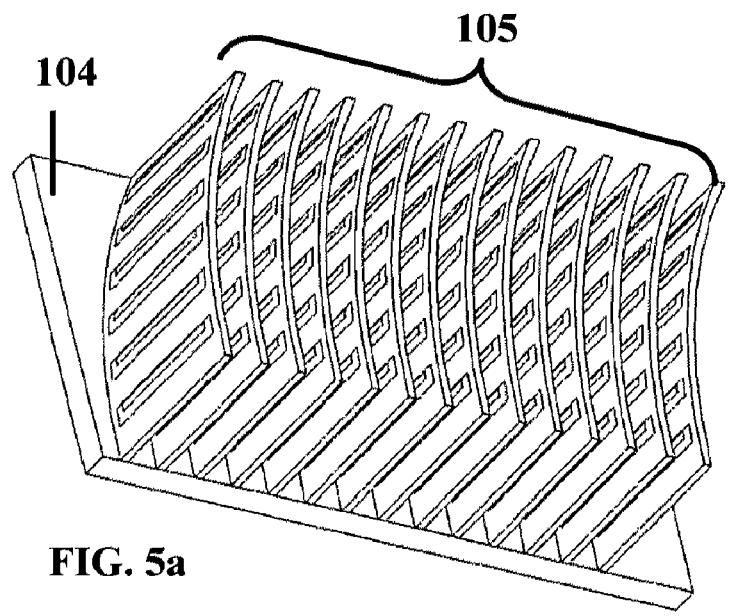
FIG. 5 illustrates a plasma-driven cooling device, according to an embodiment.
Figure 5B:
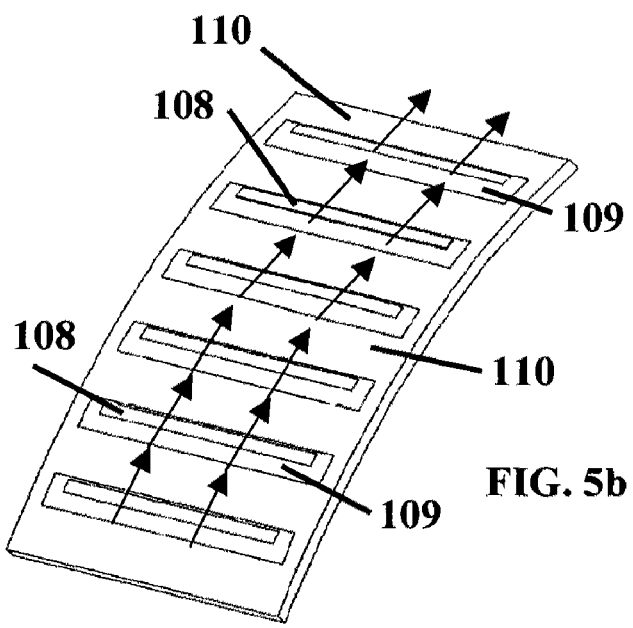

FIG. 5a illustrates a heat sink fins assembly 105 on the heat sink base 104. The heat sink fins 110 may be curve or aerodynamically streamlined for the optimum gas flow. FIG. 5b illustrates the detailed view of a heat sink fin 110. Electrodes 108 are coupled to dielectric pieces 109, and they are arranged in parallel to each other inside the heat sink fins 110. The arrows shown in the figure are the plasma-driven gas flow.

Figure 6A:
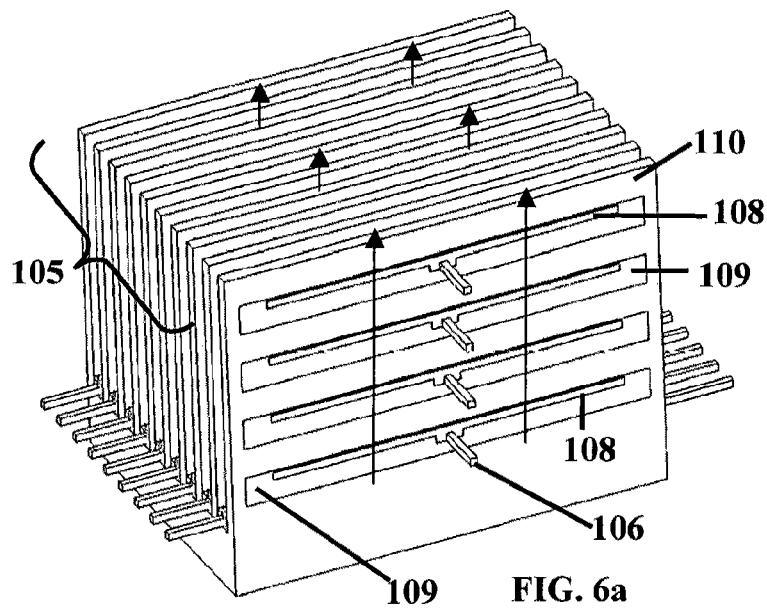
FIG. 6 illustrates a plasma-driven cooling, according to an embodiment.
Figure 6B:
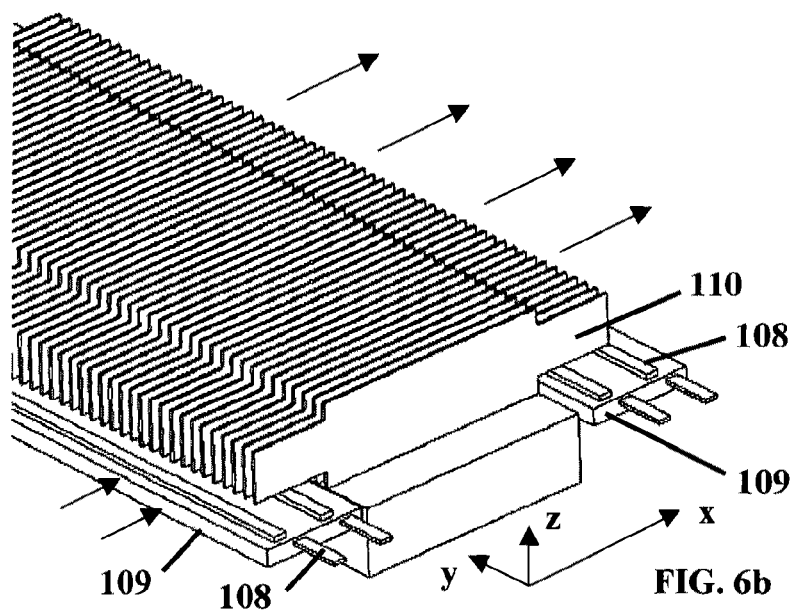
Figure 6C:
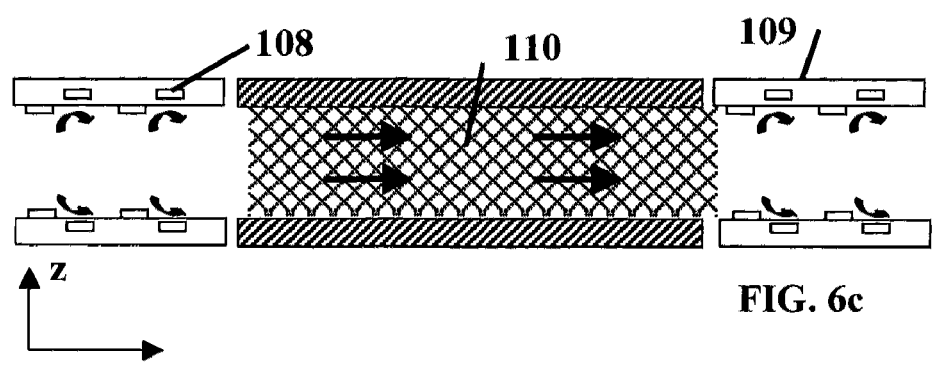
Figure 6D:
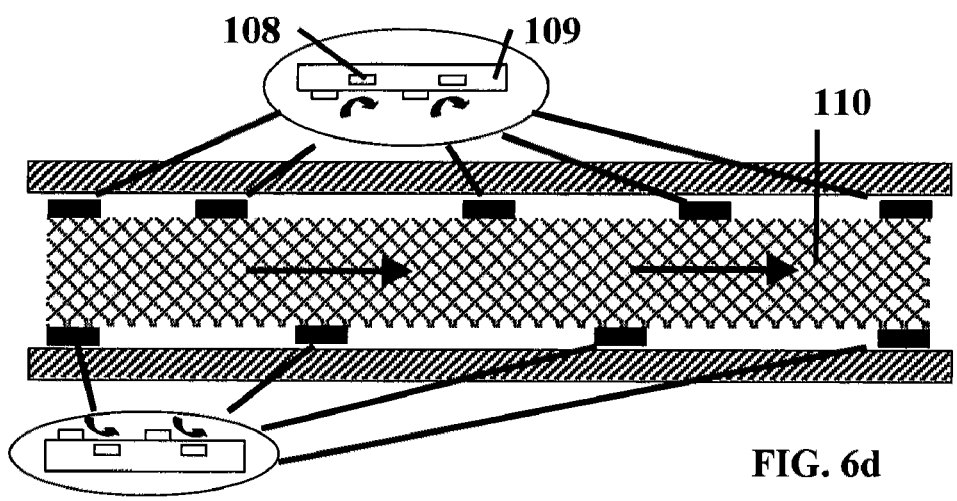

FIG. 6a illustrates a configuration of the heat sink fins assembly 105. The electrodes 108 coupled to dielectric pieces 109 may be arranged in a direction parallel to the heat sink base 104, so the gas flow is in vertical direction away from the heat sink base 104. The arrows shown in the figure indicate the plasma-driven gas flow. In one embodiment, the actuator components may be located at the entrance and exit of the heat sink fins assembly as shown in FIG. 6b. Furthermore, the actuator components may be populated at any locations inside the heat sink assembly as shown in FIG. 6c and 6d.

Figure 7A:
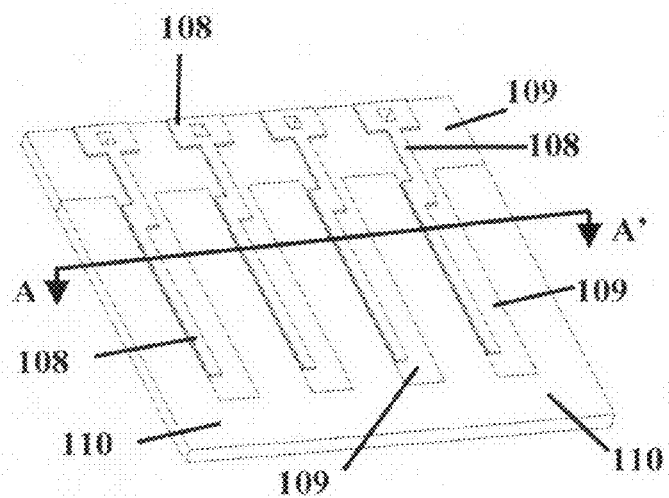
FIG. 7a illustrates the plasma-driven cooling devices coupled with heat sink fins, according to an embodiment.

FIG. 7a illustrates one embodiment of the heat sink fins assembly 105. The electrodes 108 and the dielectric pieces 109 are coupled to heat sink fins 110. Electrical voltages are applied to the electrodes 108 through lead wires 106. In another embodiment, one voltage can be applied to several electrodes 108 or to just one electrode 108.

Figure 7B:
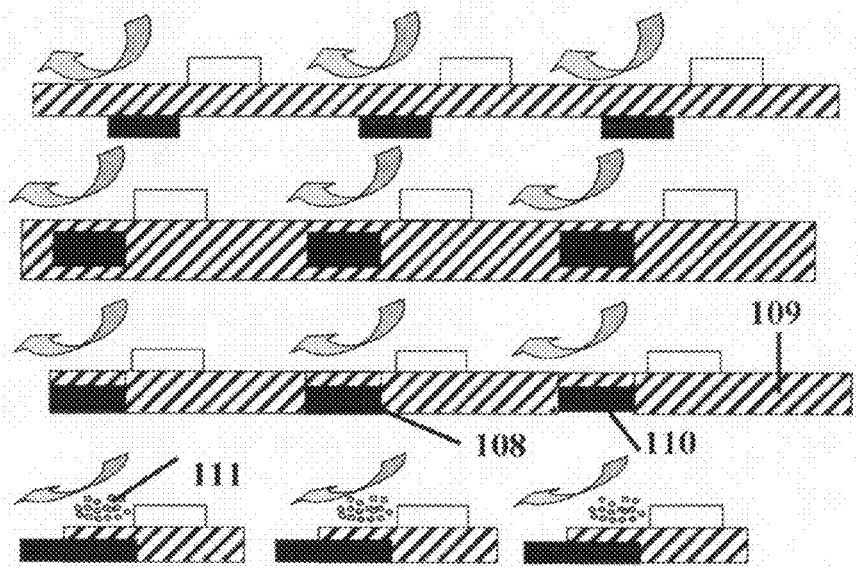
FIG. 7b illustrates electrodes, dielectric pieces, and heat sink fins are coupled together, according to an embodiment.

In one embodiment, a thin layer of dielectric material pieces 109 may be in between the electrodes 108 and heat sink fins 110 to avoid the electrical shortage and to have the dielectric barrier plasma discharge. And this is better seen by the cross-sectional view along the AA' plane as in the FIG. 7a. The cross-sectional view is shown in FIG. 7b and the figure shows that electrodes 108 are on one side and the heat sink fins 110 are on other side, and the dielectric material piece 109 may be in between. In a variation of the invention, the electrodes 108 and heat sink fins 110 may be embedded inside the dielectric layer 109 and the heat sink fins 110 may partially expose to ambient to improve the heat transfer efficiency.

Figure 8A:
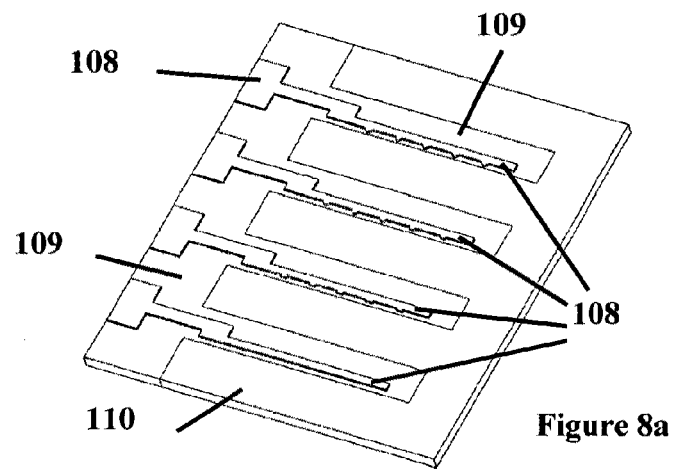
FIG. 8 illustrates the arrangements of electrodes, dielectric pieces, and heat sink fins, according to an embodiment.
Figure 8B:
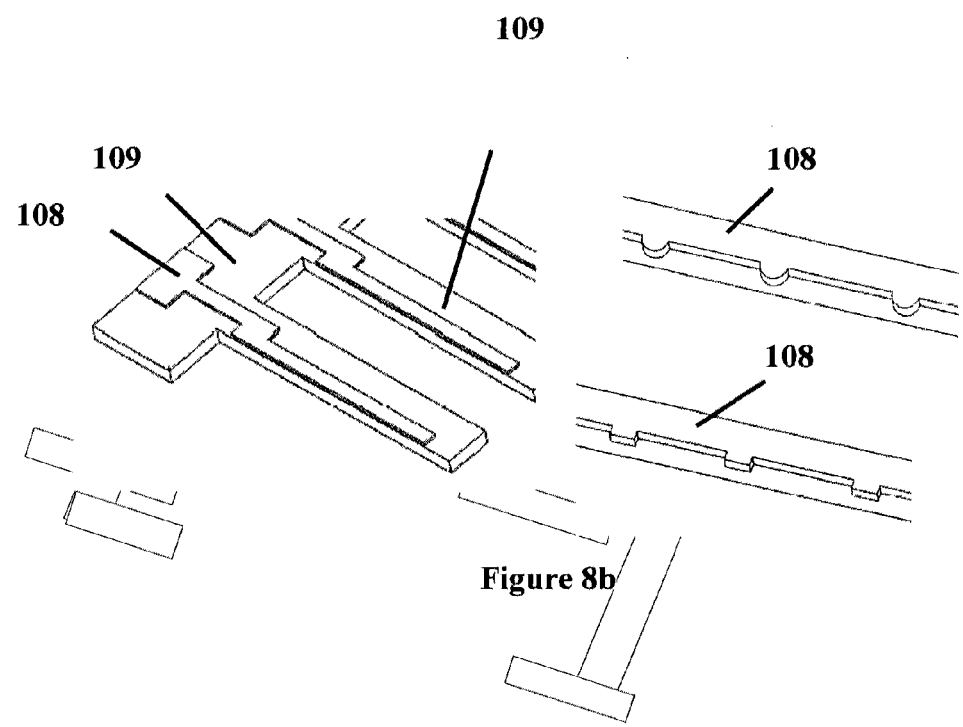

In one embodiment, the electrodes 108 and heat sink fins 110 may have varied patterns, as shown in FIG. 8a and FIG. 8b. The patterns may be flat shape, wedge shape, round shape, square shape, and other shapes. In another embodiment, the patterns may have 3D configurations and the relative locations among patterns may be varied.

FIG. 9a to FIG. 9d illustrate, viewing from top of the heat sink base, some configurations of the heat sink fins assembly 105. The arrangements of the electrodes 108, dielectric pieces 109, and heat sink fins 110, will affect the gas flow field. The arrows shown in the figures are the plasma-driven gas flow.

Figure 9A:
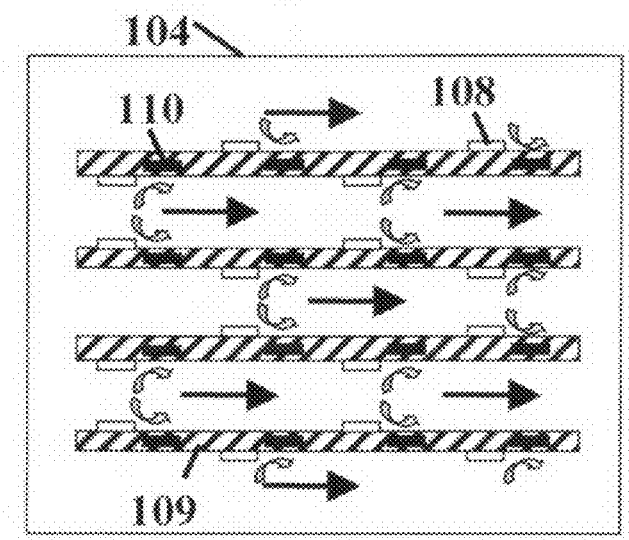
FIG. 9 illustrates the plasma-driven cooling devices on heat sink bases, according to an embodiment.
Figure 9B:
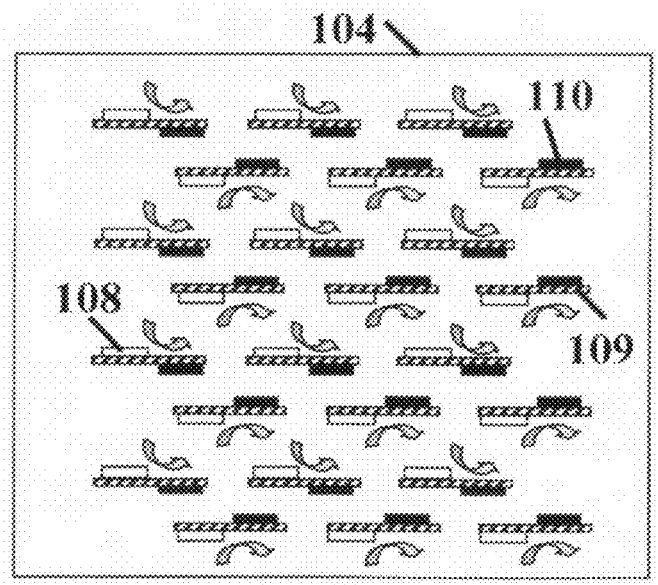
Figure 9C:
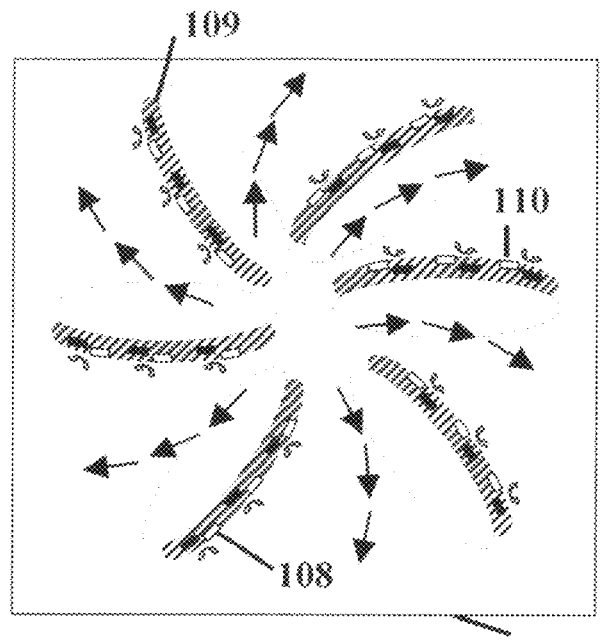
Figure 9D:
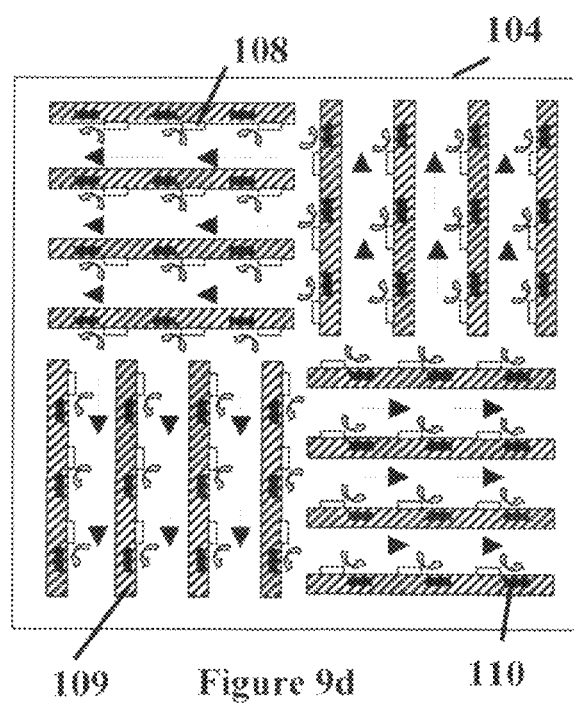

FIG. 9c illustrates that the electrodes 108 and dielectric pieces 109 coupled to heat sink fins 110 may be arranged in a circular pattern to induce the gas to flow in a spiral direction. FIG. 9d illustrates plasma-driven gas may flow in varied directions.

Figure 10A:
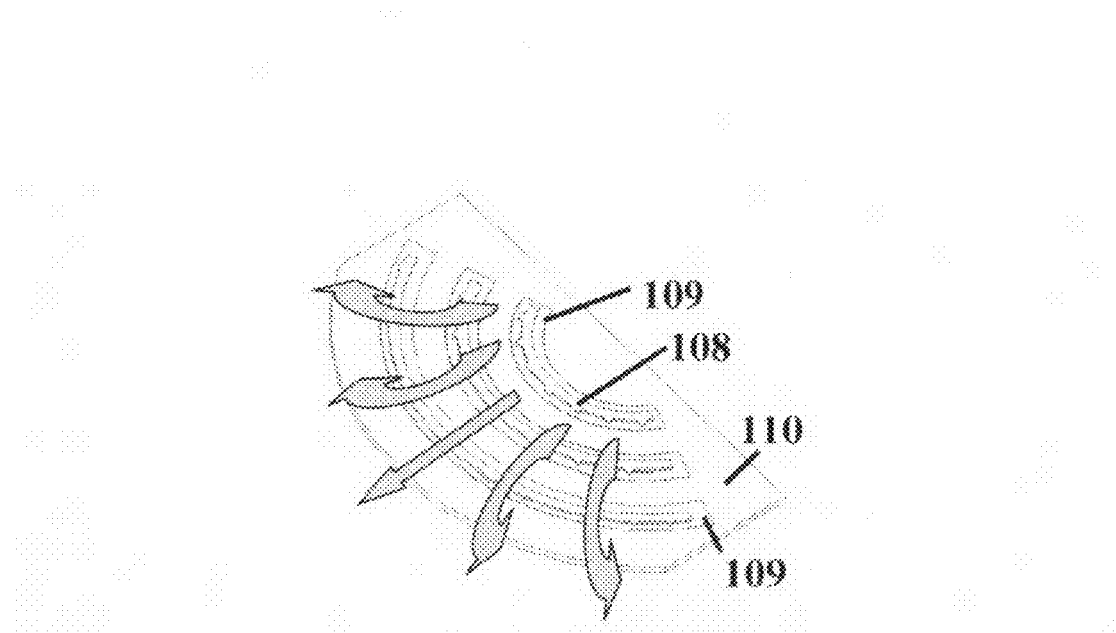
FIG. 10 illustrates the plasma-driven gas flow on heat sink fin and heat sink base, according to an embodiment.
Figure 10B:
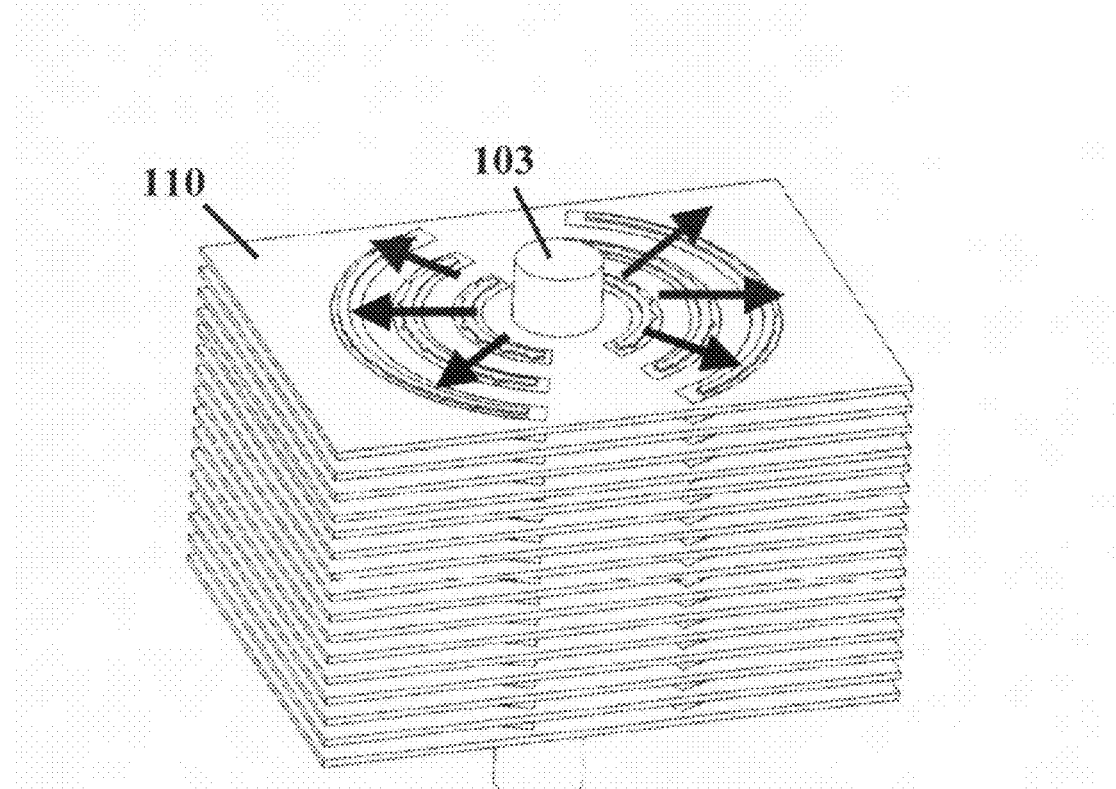

FIG. 10a illustrates the plasma-driven gas may flow in a circular direction and FIG. 10b illustrates such an application. A heat transfer pipe 103 may couple to heat source 101 and heat sink fins 110. The heat transfer pipe 103 is in the middle and the circular pattern of the electrodes 108 and dielectric pieces 109 may help the heat transfer in a radial direction. In one embodiment, the configurations of heat transfer pipes and the patterns of electrodes 108 strips and dielectric 109 strips may be varied.

In one embodiment, the relative locations among the electrodes 108 and heat sinks 110 can be varied in order to attain specific plasma patterns and distributions. And in anther embodiment, the thickness of the electrodes 108, dielectric layers 109, and heat sink fins 110 may vary as well for desired distribution of voltage, plasma field, and fluid flowing field. In general, the arranged patterns of electrodes 108, dielectric pieces 109, and heat sink fins 110 in FIG. 9 and FIG. 10 are regular. In another embodiment, the arranged patterns of electrodes 108, dielectric pieces 109, and heat sink fins 110 may be irregular.

Figure 11A:
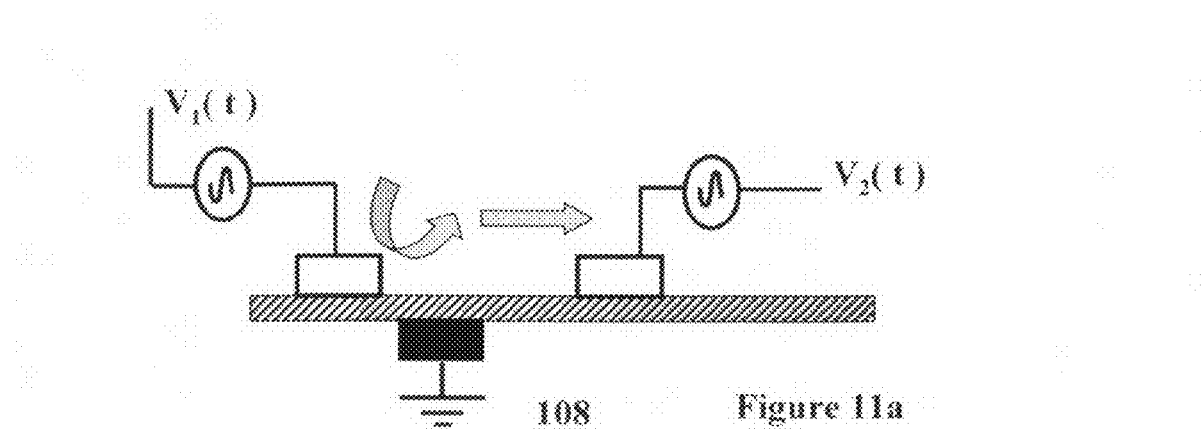
FIG. 11 illustrates the voltages are applied to electrodes on the plasma-driven cooling devices, according to an embodiment.
Figure 11B:
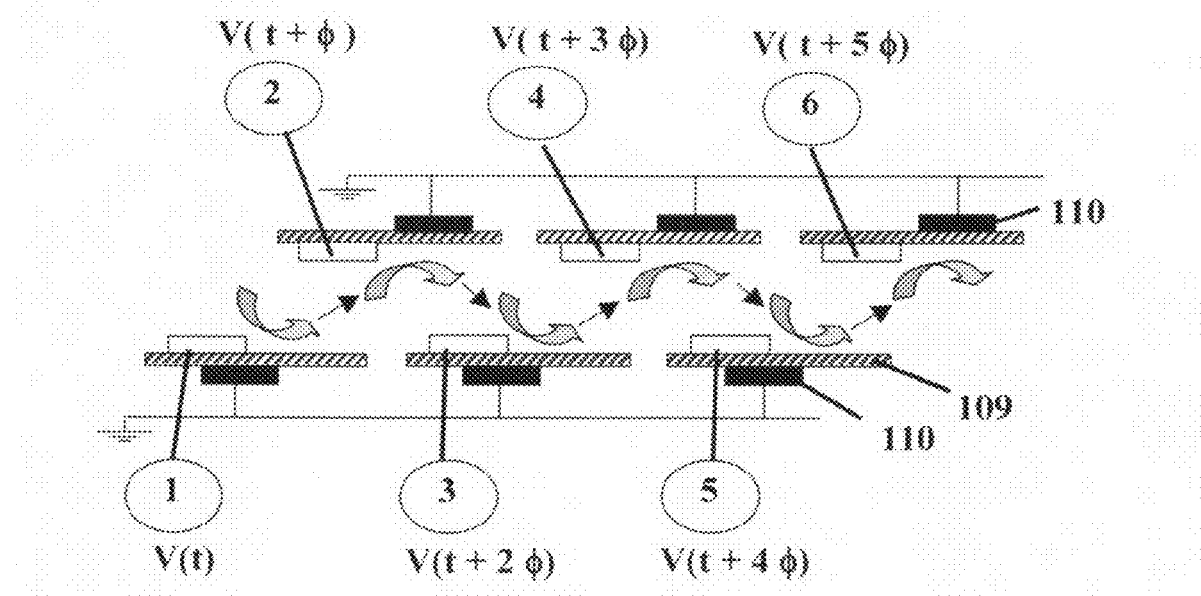
Figure 11C:
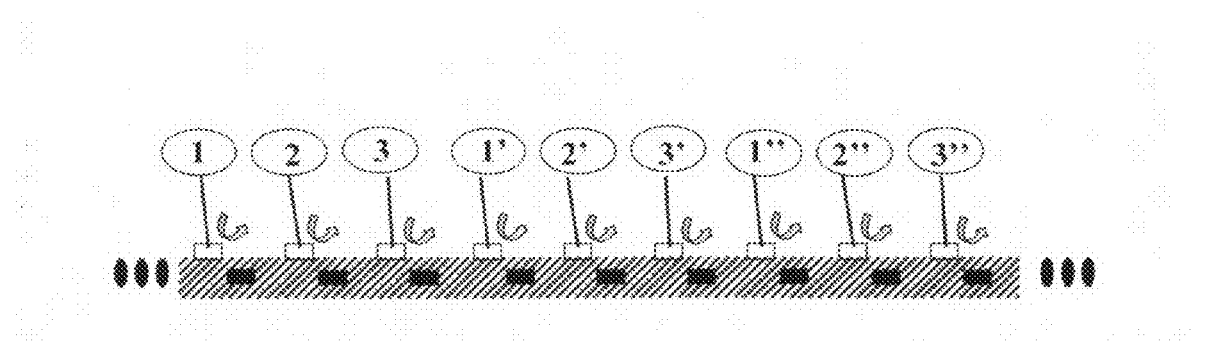

FIG. 11a to FIG. 11d illustrates several ways of driving plasma actuators. FIG. 11a has three electrodes 108. The voltages applied to the electrodes may be different to control the ions flow. FIG. 11b illustrates that different numbers of electrodes 108 and heat sink fins 110 may be used. The voltages and phase angle $\phi$ may be varied to control the ions to flow from left to right. FIG. 11c illustrates another configuration. The electrodes 108 on group of 1, 1', and 1" may be applied with one voltage together, group of 2, 2', and 2" may be applied with one voltage together, and group of 3, 3', and 3" may be applied with another voltage together. The configuration will drive the gas flow in each group but the entire gas is moving altogether.

Figure 11D:
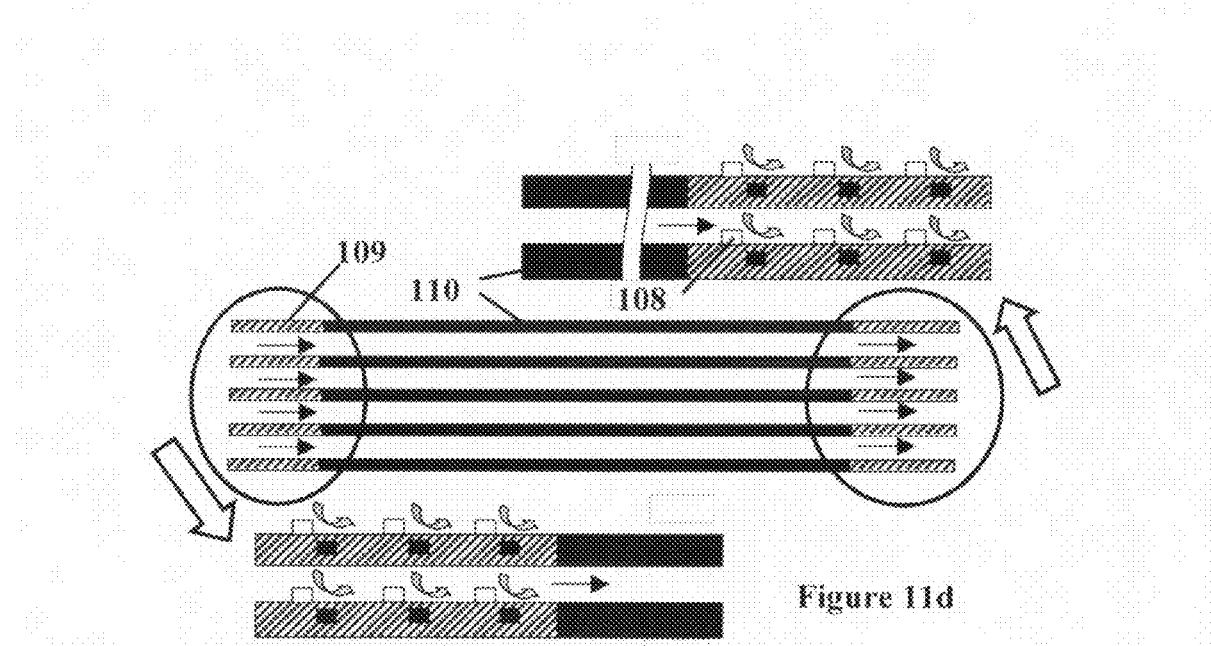

FIG. 11d illustrates one configuration to cool down heat sink fins 110. The plasma actuators may locate at heat sink inlet, at heat sink outlet, or at any locations inside the heat sink assembly 105. The actuators in the figure are used to push the gas to flow into heat sink fin assembly 105, and to pump out the gas from heat sink fin assembly 105. Therefore, the heat sink fins 110 is cooled down.

FIG. 11a to FIG. 11d are a non-exhaustive list of the configurations. Varied configurations may be applied but should be considered within the scope of the embodiments here. These variations include, the sequence of applying voltages to electrodes, the time period of applying voltages, the numbers of electrodes 108 and heat sink fins 110. In one embodiment, the applied voltages to the electrodes 108 may be a constant voltage, an impulse voltage, a harmonic voltage, a transient voltage, or a combination. The heat sink fins 110 may act as electrodes and may be electrically grounded or non-grounded, such as, applying them with nonzero electrical potentials. In another embodiment, the amplitude, phase shift, and frequency of the applied voltages may be varied, and the voltages waveforms may be sine, cosine, triangular, or any irregular forms.

Figure 12A:
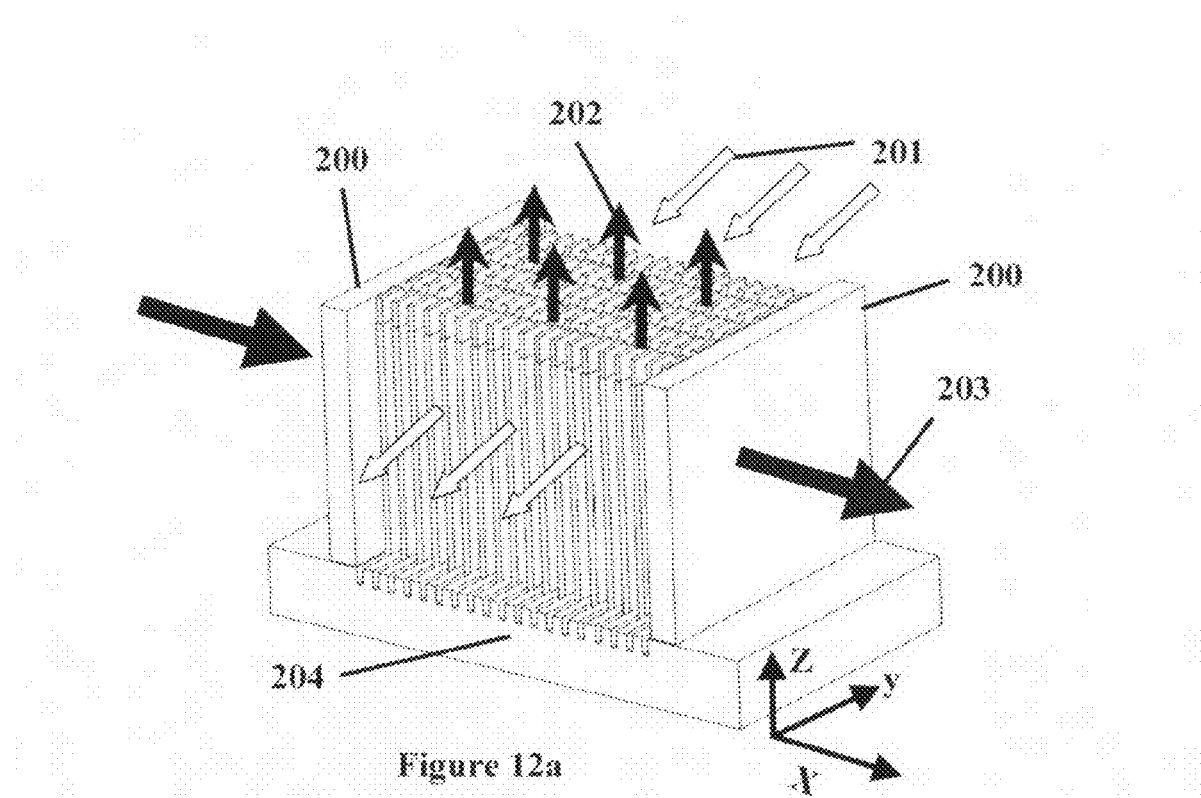
FIG. 12 illustrates the plasma-driven gas flow on the heat sink fins, according to an embodiment.
Figure 12B:
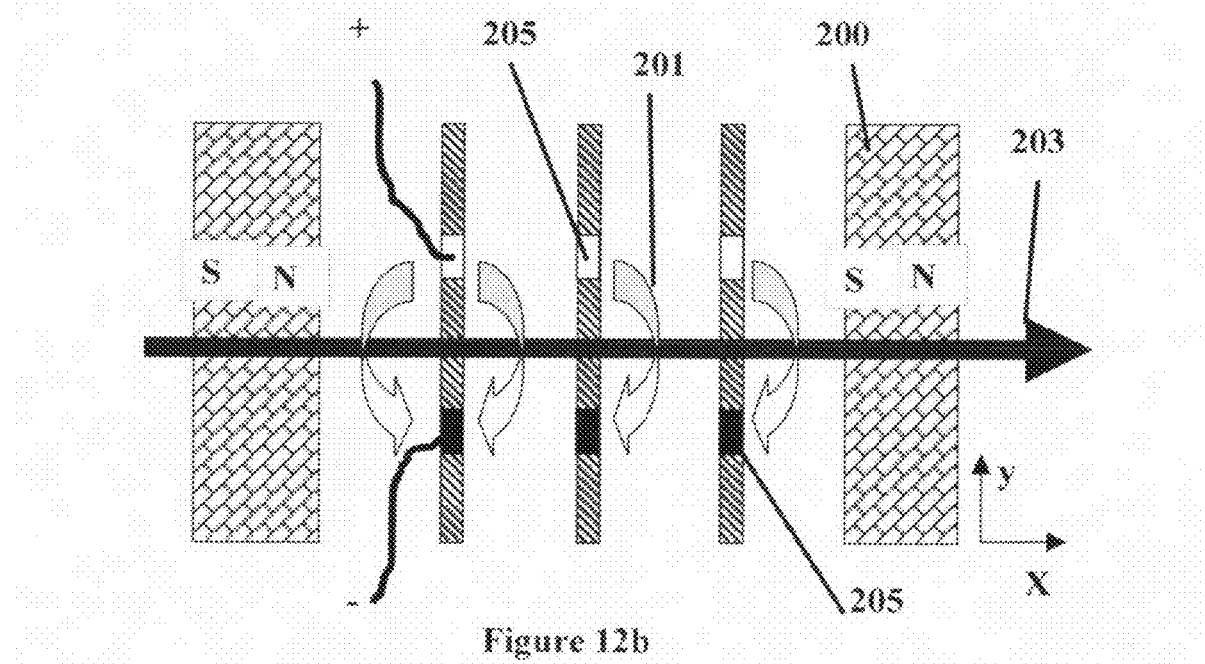
Figure 12C:
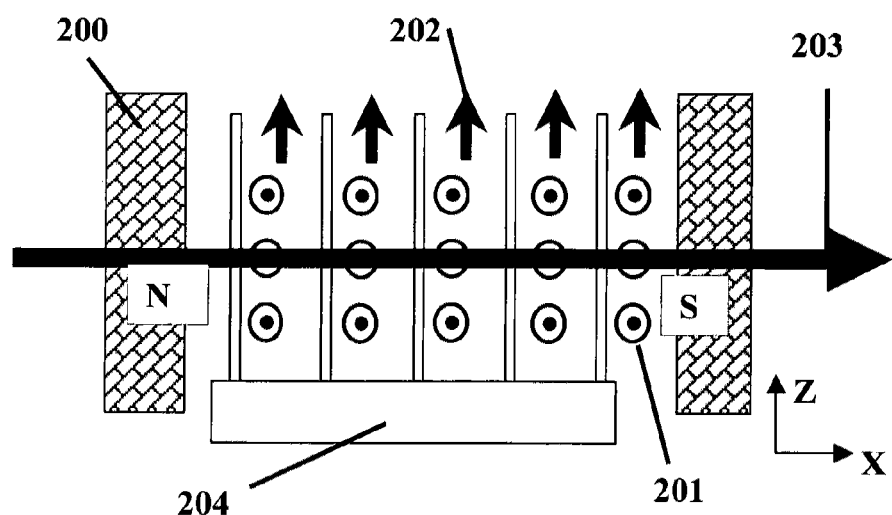

The plasma flow cooling may be enhanced by magnet 200. FIG. 12a illustrates two pieces of magnets 200 enclosing the assembly of heat sink fins on a heat sink base 204. High strength of the magnetic field is between magnets. FIG. 12b shows the cross sectional view of the system in z direction. By applying appropriate voltages to the electrodes 205, a flow of plasma 201 is induced in negative y direction. This plasma-driven gas flow induces the cooling of the heat sink fins along y direction. FIG. 12c shows the cross sectional view in y direction. Because of the magnetic field 203, the plasma flow 201 will also induce the gas flow 202 along z direction and therefore the cooling of the heat sink in z direction is achieved as well.

Figure 13A:
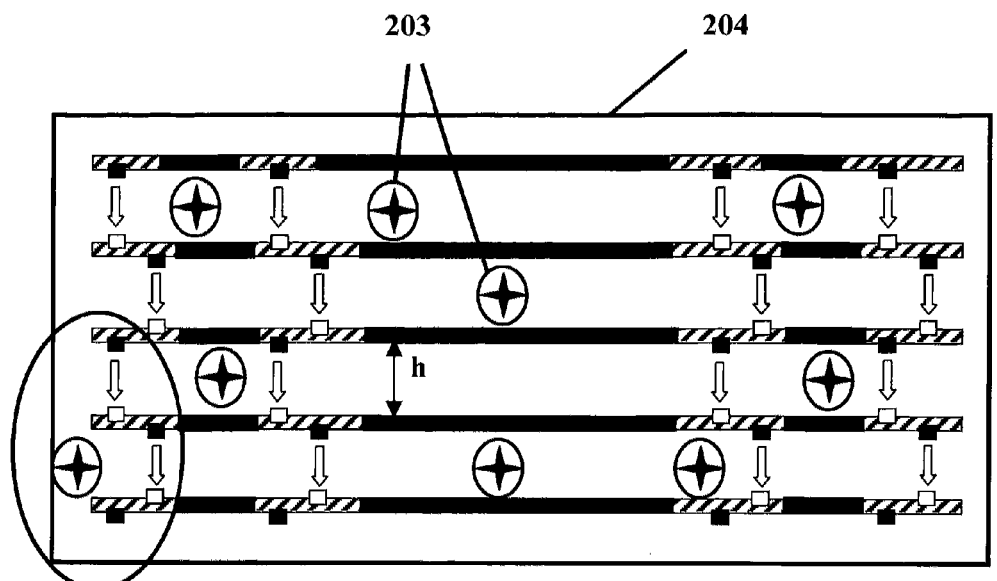
FIG. 13 illustrates a magnetic circuit is coupled to a plasma-driven cooling device, according to an embodiment.
Figure 13B:
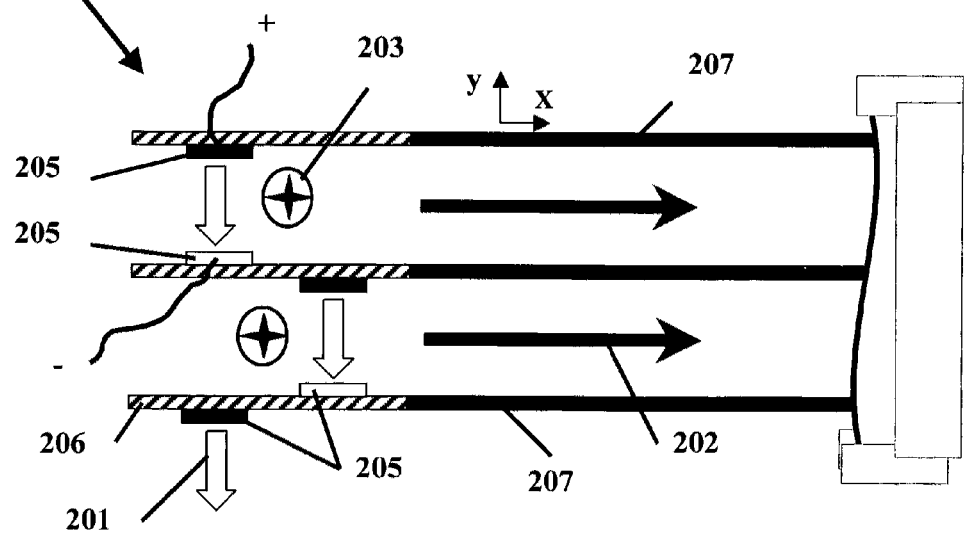
Figure 13C:
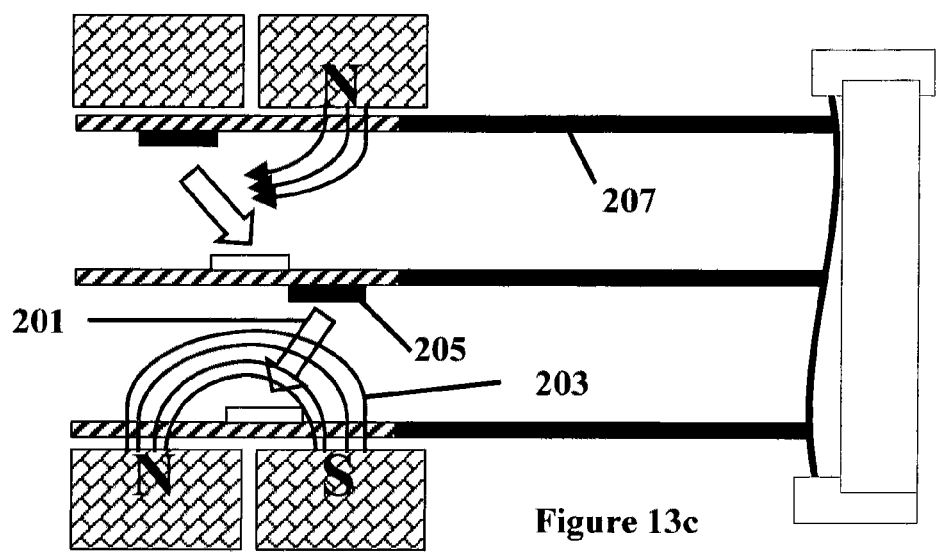

FIG. 13a illustrates a top view of several heat sink fins 207 on a heat sink base 204. The magnetic field direction 203 is going into the paper. The plasma-driven gas flow 201 is between electrodes 205. The plasma flow 201 here is affected by the electrical potential distribution of the electrodes 205 and heat sink fins 207, and by the external magnetic field 203. As mentioned earlier, by decreasing the pitch between heat sink 207 fins, and by increasing the total number of heat sink fins 207, the heat transfer will be enhanced because larger surface areas can be used for convective heat transfer. However, as the distances between heat sink fins 207 get smaller, it becomes more difficult for air to flow inside. In one embodiment, an external magnetic field 203 may be provided to enhance the plasma flow 201. FIG. 13b illustrates, by applying appropriate voltages to the electrodes 205, which are coupled to dielectric material 206, and by providing an external magnetic field 203, as shown in the figure that the direction is flowing into the paper, the induced gas flow 202 will therefore cool down the heat sink fins 207. In one embodiment, the design can be used as an impinging flow at the heat sink fins 207 inlet, at the heat sink fins 207 outlet, and at any locations inside heat sink fins 207. In a similar way as FIG. 13*a* and FIG. 13*b*, the magnetic field can be applied to previous configurations, such as FIG. 11*d*, to enhance the plasma-driven gas flow. FIG. 13*c* illustrates another example, which uses small magnets inside the heat sink system. One of the applications is to create local turbulence on the heat sink fin surface. A plasma gas flow near the heat sink fin surface will disturb the fluid boundary layer and add the momentum to the fluid. In a further embodiment, the electrical polarity of the electrodes may be positive or negative by changing the applied voltages values, and the magnetic field 203 can be generated by permanent magnets or by electromagnets.

In another embodiment, varied configurations of magnetic circuit and electrodes 205 can be used in the system to enhance the plasma driven gas flow and to make the gas flow become turbulent. The turbulent flow is due to the interactions of magnetic field 203, electrical field, and the plasma flow inside the system. The variations of the configurations include, for example, the electrodes 205 can be line pattern, discrete square-pad patterns, or other patterns; the magnetic circuit can be composed of bulk magnets which enclosing heat sink fins, or by small magnets embedded inside heat sink fins assembly to drive the plasma flow; the magnet field distribution can be varied by magnets shape, by magnets dimensions, by magnets locations, by magnet orientation, by grades of magnets, by the relative location between magnets and electrodes, and by the direction and magnitude of electrical field; the applied voltages can be static, transient, AC, DC, and the voltages can have any waveforms, varied amplitude, and varied phase shifts. And all these variations should be considered within the scope of the embodiments.

Therefore, this invention discloses an apparatus for cooling an electronic device. The apparatus includes an array of plasma-driven cooling fins each having a surface for disposing an electrode thereon for applying a voltage thereon to ionize and generate plasma from air near the cooling fins as that shown in FIGS. 1, 2, and 3. FIG. 1 further shows the apparatus with the array of plasma-driven cooling fins is coupled to a heat sink through direct contact, through a heat sink base, a heat sink pipe or heat transferring attachment. In an exemplary embodiment as shown in FIG. 1, the electrode disposed on each of the plasma-driven cooling fins is connected to a power supplier having a controller for controlling voltage provided to the electrode on each of the plasma-driven cooling fins for controlling a cooling rate. In FIG. 3, the apparatus further includes a plurality of sharp electrodes couple to a heat sink base supporting the array of plasma-driven cooling fins wherein the sharp electrodes are arranged in multiple array with multiple patterns. In FIG. 4, the surface of each of the array of plasma-driven cooling fins further having a plurality of dielectric pieces and electrodes disposed thereon. In FIG. 11, the electrode disposed on each of the plasma-driven cooling fins is connected to a power supplier having a controller for controlling voltage provided to the electrode on each of the plasma-driven cooling fins for inducing a plasma flow in a space between the cooling fins. In the exemplary embodiment shown in FIGS. 3 and 4, the electrode disposed on each of the plasma-driven cooling fins is connected to a power supplier having a controller for controlling voltage provided to the electrode on each of the plasma-driven cooling fins for inducing a plasma flow in a space between the cooling fins along a vertical direction flowing from a heat sink base disposed at a bottom and supporting the cooling fins toward a top portion of the cooling fins away from the heat sink base. In another exemplary embodiment, the electrode disposed on each of the plasma-driven cooling fins is connected to a power supplier having a controller for controlling voltage provided to the electrode on each of the plasma-driven cooling fins for inducing a plasma flow in a space between the cooling fins along a parallel direction to a surface of a heat sink base disposed at a bottom and supporting the cooling fins. In another exemplary embodiment, the electrode disposed on each of the plasma-driven cooling fins is connected to a power supplier having a controller for controlling voltage provided to the electrode on each of the plasma-driven cooling fins for inducing a plasma flow in a space between the cooling fins along different directions including a parallel direction to a surface of a heat sink base disposed at a bottom and supporting the cooling fins and also flowing in a direction away from the heat sink base. In another exemplary embodiment, at least some of the plasma-driven cooling fins are configured to have different distances between two adjacent cooling fins. In another exemplary embodiment, the at least some of the plasma-driven cooling fins are configured to have different distances between two adjacent cooling fins including two adjacent cooling fins overlapping each other, physically contact each other, or having variable distance between each other. In another exemplary embodiment, at least some of the electrodes disposed on surface of the plasma-driven cooling fins are configured to have different distances between two adjacent electrodes. In another exemplary embodiment, each of the cooling fins further having a dielectric piece disposed thereon for placing an electrode thereon and at least some of the dielectric piece disposed on surface of the plasma-driven cooling fins are configured to have different distances between two adjacent dielectric pieces. In another exemplary embodiment, at least some of the electrodes disposed on surface of the plasma-driven cooling fins are configured to have different distances between two adjacent electrodes including two adjacent electrodes overlapping each other, physically contact each other, or having variable distance between each other. In another exemplary embodiment, each of the cooling fins further having a dielectric piece disposed thereon for placing an electrode thereon and at least some of the dielectric piece disposed on surface of the plasma-driven cooling fins are configured to have different distances between two adjacent dielectric pieces including two adjacent dielectric pieces overlapping each other, physically contact each other, or having variable distance between each other. In another exemplary embodiment, at least some of the cooling fins and the electrodes have patterned edges suitable for specific cooling applications. In another exemplary embodiment, the cooling fins with the electrodes thereon are configured to adapt to special aerodynamically streamlined configuration for cooling enhancement of the electronic device. In another exemplary embodiment, the cooling fins with the electrodes thereon are configured with particularly application of voltages on the electrodes for inducing and controlling plasma gas flows to flow at controllable directions with adjustable turbulences at different locations of the apparatus for cooling the electronic device. In another exemplary embodiment, the apparatus further includes a power supply controller for controlling different voltages applied to the electrodes including DC or AC voltages, steady or transient voltages, voltages having a range of frequencies and amplitudes, voltages having phase shifts, voltages applied at different and adjustable time periods, and voltages applied with adjustable time sequences. the cooling fins with the electrodes thereon are configured to induce a plasma gas flow at an inlet, an outlet or at an internal location of the apparatus for cooling the electronic device and the electrodes are configured to induce a local turbulent plasma flow for disturbing a flow boundary layer to increase an cooling efficiency in cooling the electronic device. In another exemplary embodiment, the apparatus further includes thermal sensors to measure a temperature or temperature distribution for inputting to a power supply controller for controlling a cooling rate of the apparatus for cooling the electronic device. In another exemplary embodiment, the apparatus further includes a magnetic circuit to generate a magnetic field to interact with an electric field generate by voltages applied to the electrodes for controlling a plasma gas flow in the apparatus for cooling the electronic device. In another exemplary embodiment, the apparatus further includes a magnetic circuit including permanent magnets of electromagnets configured with different shapes and sizes at different locations to generate a magnetic field to interact with an electric field generate by voltages applied to the electrodes for controlling a plasma gas flow in the apparatus for cooling the electronic device. In another exemplary embodiment, the apparatus further includes a heat transfer pipe connected to a heat source including a microprocessor package, a graphic processor chip, an application specific integrated circuit (ASIC) chip, a video processor chip, a graphic card, a digital signal processing (DSP) chip, a memory chip and a hard drive disk drive for connecting to a microprocessor power supply. In another exemplary embodiment, the apparatus further have gas flows composed of the plasma gas and air, nitrogen, oxygen and at least fluids of different compositions. In another exemplary embodiment, the electrodes are composed of gold, copper, nickel, tungsten, or other electrically conductive materials. In another exemplary embodiment, each of the cooling fins further having a dielectric piece disposed thereon for placing an electrode thereon and the dielectric pieces are composed of Teflon, Kapton, and other dielectric materials.

In one embodiment, the plasma actuators, which include electrodes 108, dielectric pieces 109, and heat sink fins 110, may be made by traditional photolithographic fabrication method, by laser cutting and attachment method, or by a manner similar to the manufacturing of PCB, or by other methods. In another embodiment, the invention is not limited to bulk scale, but also apply to the micro scale and nano scale. The plasma actuators made in a smaller scale may be benefited more from the invention here, such as, smaller pitch of the heat sink fins will make the required electrical potential applied to electrodes become smaller.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An apparatus for cooling an electronic device, comprising:
    an array of plasma-driven cooling fins each having a surface for disposing an electrode thereon for applying a voltage thereon to ionize and generate plasma from air near said cooling fins; and
    the electrode disposed on each of said plasma-driven cooling fins is connected to a power supplier having a controller for controlling voltage provided to said electrode on each of said plasma-driven cooling fins for inducing a plasma flow in a space between said cooling fins along different directions including a parallel direction to a surface of a heat sink base disposed at a bottom and supporting said cooling fins and also flowing in a direction away from said heat sink base.

2. The apparatus for cooling an electronic device of claim 1, wherein:
    the array of plasma-driven cooling fins is coupled to a heat source through direct contact, through a heat sink base, a heat sink pipe or heat transferring attachment.

3. The apparatus for cooling an electronic device of claim 1, wherein:
    the electrode disposed on each of, said plasma-driven cooling fins is connected to the power supplier having the controller for controlling voltage provided to said electrode on each of said plasma-driven cooling fins for controlling a cooling rate.

4. The apparatus for cooling an electronic device of claim 1, further comprising:
    a plurality of sharp electrodes couple to a heat sink base supporting said array of plasma-driven cooling fins wherein the sharp electrodes are arranged in multiple array with multiple patterns.

5. The apparatus for cooling an electronic device of claim 1 wherein:
    said surface of each of said array of plasma-driven cooling fins further having a plurality of dielectric pieces and electrodes disposed thereon.

6. The apparatus for cooling an electronic device of claim 1 wherein:
    the electrode disposed on each of said plasma-driven cooling fins is connected to the power supplier having the controller for controlling voltage provided to said electrode on each of said plasma-driven cooling fins for inducing the plasma flow in the space between said cooling fins along a vertical direction flowing from the heat sink base disposed at a bottom and supporting said cooling fins toward a top portion of said cooling fins away from said heat sink base.

* * * * *